US008502612B2

(12) United States Patent
Mosalikanti et al.

(10) Patent No.: US 8,502,612 B2
(45) Date of Patent: Aug. 6, 2013

(54) METHOD AND APPARATUS FOR DETERMINING WITHIN-DIE AND ACROSS-DIE VARIATION OF ANALOG CIRCUITS

(75) Inventors: Praveen Mosalikanti, Portland, OR (US); Nasser A. Kurd, Portland, OR (US); Timothy M. Wilson, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/197,525

(22) Filed: Aug. 3, 2011

(65) Prior Publication Data

US 2011/0285469 A1 Nov. 24, 2011

Related U.S. Application Data

(63) Continuation of application No. 12/492,940, filed on Jun. 26, 2009, now Pat. No. 8,031,017.

(51) Int. Cl.
*G01R 23/02* (2006.01)
*G01R 27/00* (2006.01)
*H03K 3/03* (2006.01)

(52) U.S. Cl.
USPC ........... 331/108 D; 331/44; 331/57; 331/185; 702/65; 702/71; 702/75; 702/79; 702/118; 702/179

(58) Field of Classification Search
USPC ........... 327/153, 161, 182, 183, 530; 331/44, 331/57, 108 D, 185, 186; 702/64–66, 71, 702/75, 79, 118, 179
See application file for complete search history.

(56) References Cited

U.S. PATENT DOCUMENTS

| | | | | |
|---|---|---|---|---|
| 5,952,892 A * | 9/1999 | Szajda | ............................ | 331/57 |
| 6,157,266 A * | 12/2000 | Tsai et al. | ........................ | 331/57 |
| 6,215,368 B1 * | 4/2001 | Tagami et al. | ............ | 331/108 B |
| 6,222,423 B1 * | 4/2001 | Sudjian | ............................ | 331/57 |
| 6,553,545 B1 | 4/2003 | Stinson et al. | | |
| 6,695,475 B2 * | 2/2004 | Yin | ................................ | 374/171 |
| 6,882,238 B2 * | 4/2005 | Kurd et al. | .................... | 331/186 |
| 7,171,333 B2 * | 1/2007 | Nassif | ............................ | 702/179 |
| 7,463,096 B2 * | 12/2008 | Chi et al. | ........................... | 331/2 |
| 7,548,823 B2 * | 6/2009 | Singh et al. | ..................... | 702/79 |
| 7,742,887 B2 | 6/2010 | Patel et al. | | |
| 7,760,033 B2 | 7/2010 | Podmanik et al. | | |
| 7,863,941 B1 * | 1/2011 | Nguyen et al. | ................... | 327/67 |

(Continued)

OTHER PUBLICATIONS

Notice of Allowance mailed Apr. 21, 2011 for U.S. Appl. No. 12/492,940.

(Continued)

*Primary Examiner* — Levi Gannon
(74) *Attorney, Agent, or Firm* — Blakely, Sokoloff, Taylor & Zafman LLP

(57) ABSTRACT

Described herein is the method and apparatus for determining frequency of an oscillator coupled with one or more analog devices, and for determining within-die or across-die variations in an analog property associated with the one or more analog devices, the determining based on the oscillator frequency. The analog property includes output signal swing, bandwidth, offset, gain, and delay line linearity and range. The one or more analog devices include input-output (I/O) buffer, analog amplifier, and delay line. The method further comprises updating a simulation model file based on the determining of the within-die and/or across-die variations of the analog property.

18 Claims, 6 Drawing Sheets

U.S. PATENT DOCUMENTS

| | | | | |
|---|---|---|---|---|
| 7,868,706 | B2 * | 1/2011 | Nissar et al. | 331/57 |
| 8,224,604 | B1 * | 7/2012 | Amrutur et al. | 702/79 |
| 8,258,883 | B2 * | 9/2012 | Chen et al. | 331/57 |

OTHER PUBLICATIONS

Non-Final Office Action mailed Jan. 26, 2011 for U.S. Appl. No. 12/492,940.

Drake, A. et al., "A Distributed Critical-Path Monitor for a 65nm High-Performance Microprocessor", ISSCC Dig. Tech. Papers, Feb. 2007, (2007), pp. 398-399.

Klass, F. et al., "An All-Digital On-Chip Process-Control Monitor for Process-Variability Measurements", 2008 IEEE International Solid-State Circuits Conference, ISSCC 2008, Session 22, Variation Compensation & Measurement, 22.5, (2008), pp. 408-409, 623.

Liang-Teck Pang et al., "Measurements and Analysis of Process Variability in 90 nm CMOS", IEEE Journal of Solid State Circuits, vol. 44, No. 5, May 2009, pp. 1655-1663.

Mukhopadhyay, S. et al., "Statistical Characterization and On-Chip Measurement Methods for Local Random Variability of a Process Using Sense-Amplifier Based Test Structure", ISSCC Dig. Tech. Papers, Feb. 2007., (2007), pp. 400-401.

* cited by examiner

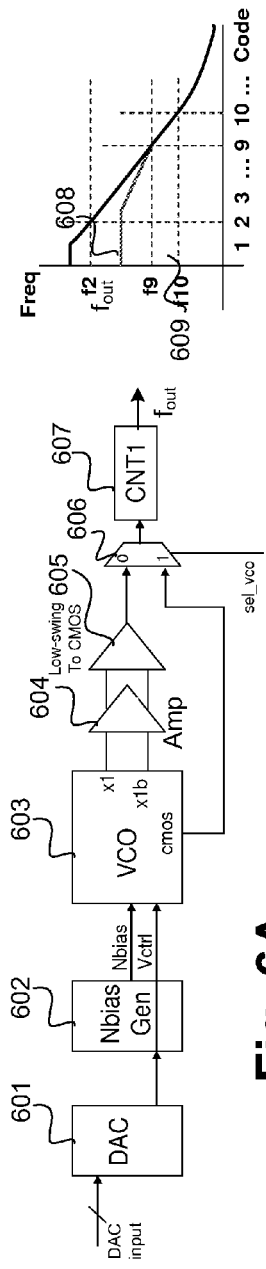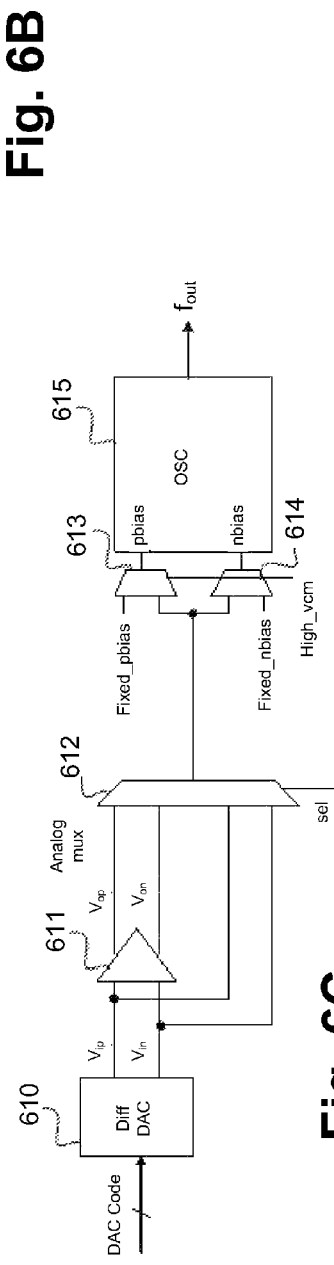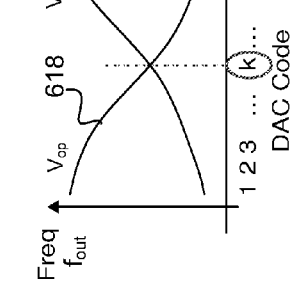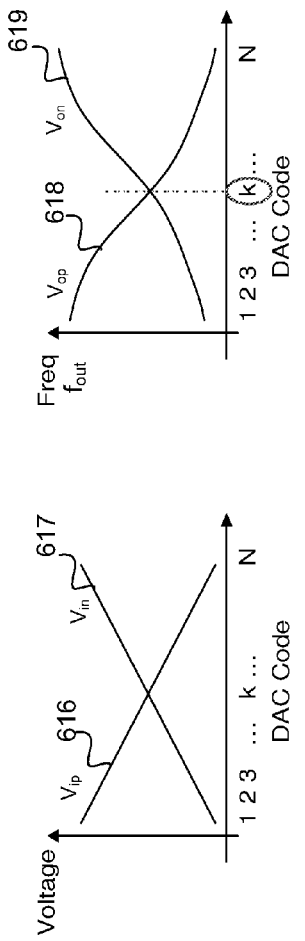

METHOD AND APPARATUS FOR DETERMINING WITHIN-DIE AND ACROSS-DIE VARIATION OF ANALOG CIRCUITS

CLAIM OF PRIORITY

The present patent application is a Continuation of, and claims priority to and incorporates by reference, the corresponding U.S. patent application Ser. No. 12/492,940, entitled, "METHOD AND APPARATUS FOR DETERMINING WITHIN-DIE AND ACROSS-DIE VARIATION OF ANALOG CIRCUITS" filed on Jun. 26, 2009, and issued as U.S. Pat. No. 8,031,017 on Oct. 4, 2011.

FIELD OF THE INVENTION

The embodiments of the invention relate generally to the field of electronic signal measurements and more particularly, to methods and apparatus of measuring analog signals (currents and voltages) in semiconductor devices to compute within-die and/or across-die variations in the semiconductor devices to enable high volume manufacturing (HVM).

BACKGROUND

Analog measurements of currents and voltages are typically very time consuming and can only be done on a small sample of electronic parts (or semiconductor devices). Generally, high cost probes and measuring equipment are needed to measure these analog currents and voltages on the semiconductor devices. These analog properties, such as bias voltage in an analog operational amplifier (OPAMP), current in a current minor, gain of an OPAMP, bandwidth of an amplifier or comparator, output voltage swing of an input-output (I/O) buffer, etc., can be measured by pulling the respective nodes associated with the above analog properties to the highest metal layer of the semiconductor process for accessing the nodes via high cost probes. Analog nodes may also be accessed from the lowest metal layer of the semiconductor device through pico-probing where the substrate is thinned and a hole dug in the region of interest. Generally, analog properties are sensitive to many factors including temperature, voltage, process, impedance of the probes that touch the nodes associated with the analog properties, etc. This sensitivity makes it challenging to measure or monitor analog properties for any given part.

Moreover, for high volume manufacturing (HVM) of semiconductor processors (or devices) a large number of measurements is required for characterizing the processors. As analog properties of analog circuits become critical due to their sensitivities to various factors, HVM becomes challenging because processors vary in their performance due to within-die variations and across-die variations in the analog properties. Additionally, measuring and/or analyzing the analog properties for a smaller, yet statistically significant, number of processors on a wafer, and also measuring and/or analyzing the analog properties of a die (processor) on a wafer, is helpful to characterize the behavior of the analog circuits and thus to characterize the process files used in simulating such analog circuits before they are manufactured in high volume.

For example, output signal swings of an input-output (I/O) buffer of a processor represent an important analog property to characterize several I/Os of the processor on a wafer and to characterize several I/Os of other processors of the same wafer or different wafer. The output signal swing of an I/O buffer generally has tight electrical specifications which are met by careful design of analog circuits associated with the I/O buffer. A slight variation in the behavior of the analog circuits (for example, change in bias voltage level, bias current level, output impedance, etc.) associated with the I/O buffer may cause the output signal swing to violate its tight electrical specification. To design a robust I/O buffer, which can sustain variations in the behavior of the analog circuits associated with the I/O buffer, a well modeled simulation process file is helpful.

BRIEF DESCRIPTION OF THE DRAWINGS

The embodiments of the invention will be understood more fully from the detailed description given below and from the accompanying drawings of various embodiments of the invention, which, however, should not be taken to limit the invention to the specific embodiments, but are for explanation and understanding only.

FIG. 6A is a circuit block diagram for extracting bandwidth, an analog property, of an amplifier/comparator according to one embodiment of the invention.

FIG. 6B is an illustration of a relationship between frequency and digital-to-analog converter (DAC) code settings for extracting bandwidth, an analog property, of an amplifier/comparator according to one embodiment of the invention.

FIG. 6C is a circuit block diagram for extracting offset and gain, analog properties, of an amplifier/comparator according to one embodiment of the invention.

FIG. 6D illustrates a transfer function of a DAC according to one embodiment of the invention.

FIG. 6E illustrates a frequency and DAC code setting relationship for comparator outputs according to one embodiment of the invention.

DETAILED DESCRIPTION

The embodiments of the invention discuss a method and apparatus of measuring analog properties (currents and voltages) in semiconductor devices to compute within-die and across-die variations in the semiconductor devices to enable high volume manufacturing (HVM) and accurate modeling of simulation process files.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or an element, that does not mean there is only one of the element. If the specification or claims refer to "an additional" element, that does not preclude there being more than one of the additional element.

Figure 1:
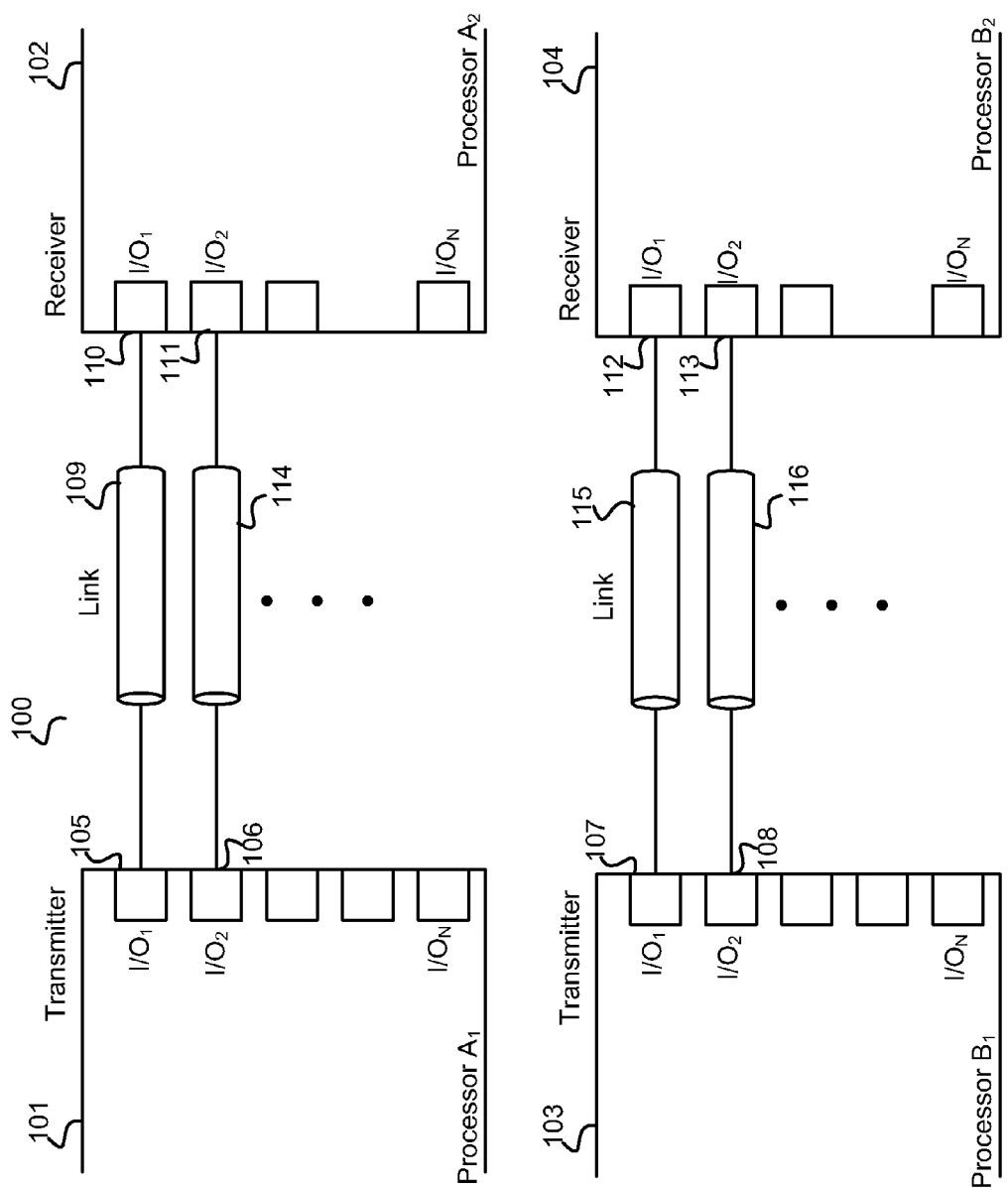
FIG. 1 is system level block diagram illustrating I/Os, capable of monitoring analog properties of their analog circuits in multiple processors communicating via links according to one embodiment of the invention.

FIG. 1 is system level block diagram 100 illustrating input-output (I/O) buffers, capable of monitoring analog properties of their analog circuits, of multiple processors communicating via links according to one embodiment of the invention. In one embodiment, processors 101 and 102 communicate with each other via I/Os (105, 110, 106, and 111) that are connected via links 109 and 114. Similarly, in one embodiment, additional processors 103 and 104 communicate with each other via I/Os (107, 112, 108, and 113) that are connected via links 115 and 116.

The I/O buffers, in one embodiment, generate signals with output signal swings according to specification of the system. In one embodiment, the output signal swing is required to be of 0.5V swing when I/Os are powered by a supply voltage of 1.0V. The output signal swing depends on many factors such as termination impedance of the transmitter and receiver, transmission line (link) impedance, drive strength of the I/O, bias circuits controlling the drive strength of the I/Os, etc. The embodiments described below will discuss how to use voltages and currents of the bias circuits associated with I/Os to compute within-die and across-die variations in the output signal swing of the I/Os. The same method may also be used for computing (or determining) within-die and across-die variations in the output impedance of I/Os.

Within-die variation refers to variation in an analog property (e.g., output swing, output impedance, gain, bandwidth, offset, delay line linearity and range, etc.) associated with an analog circuit when compared with the same analog property of another analog circuit of the same kind located on the same semiconductor die (e.g. a processor). In one embodiment, within-die variation of the output signal swing is computed between $I/O_1$ 105 and $I/O_2$ 106 of the processor $A_1$ 101, as shown in FIG. 1.

Across-die variation refers to variation in an analog property (e.g., output swing, output impedance, gain, bandwidth, offset, delay line linearity and range, etc.) associated with an analog circuit of one die when compared with the same analog property of another analog circuit of another semiconductor die. In one embodiment, both dies are either on the same semiconductor wafer or on one or more different semiconductor wafers belonging to the same process technology. In one embodiment, across-die variation of the output signal swing is computed between $I/O_1$ 105 of processor $A_1$ 101 and $I/O_1$ 107 of processor $B_1$ 103, where processor $A_1$ 101 and processor $B_1$ 103 are different dies of the same semiconductor wafer.

Figure 2:
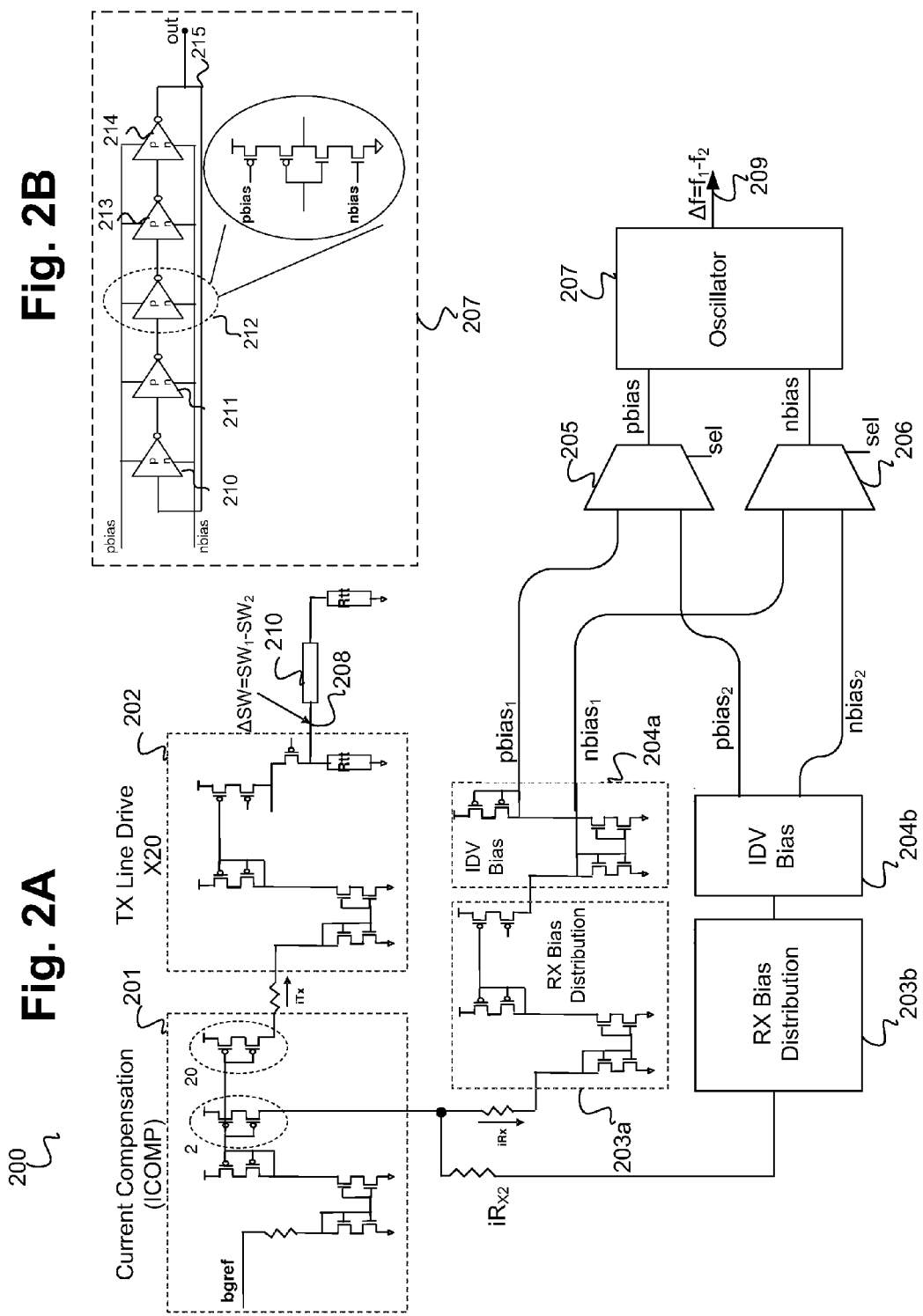
FIG. 2A is a circuit level block diagram of an I/O illustrating converting analog properties to frequency via an oscillator for characterizing output signal swing of the I/O according to one embodiment of the invention.
FIG. 2B is a circuit diagram of an oscillator to convert analog properties to frequency according to one embodiment of the invention.

FIG. 2A illustrates part of an I/O buffer architecture 200 with multiple I/O buffers 202 (only part of a transmitter is shown in FIG. 2A) configured to receive compensated analog current, iTx, from a bias generation circuit, according to one embodiment of the invention. The bias generation circuit, in one embodiment is a compensation block (ICOMP) 201. In one embodiment, the bias generation circuit is a band-gap reference circuit. However, other embodiments may have different bias generation circuits. The ICOMP 201 generates, in one embodiment, controlled current iTx for I/O 202 so that it may have a controlled output signal swing at 208 and/or controlled output impedance Rtt.

In one embodiment, the ICOMP unit 201 provides compensation current iTx to twenty I/Os 202, as shown by a single block in FIG. 2A. The analog bias generation circuit (ICOMP unit 201) is operable, in one embodiment, to compensate the output signal swing of the I/O buffer across parameters including process, voltage, and temperature. The I/Os 202 are coupled with a communication link such as a transmission line 210. In one embodiment, the I/O buffers 202 are implemented as current-mode buffers. In another embodiment, the I/O buffers 202 are implemented as voltage mode buffers. The transmission line 210, in one embodiment, is terminated with a termination resistor Rtt. In another embodiment, the transmission line 210 is coupled with a receiver (not shown in FIG. 2A).

In one embodiment, the ICOMP unit 201 provides compensation current iTx to fewer or more than twenty I/Os. Any variation in the operation of the ICOMP 201, for example, caused by random and/or systematic process variation may, in one embodiment, vary iTx current which in turn varies the output signal swing of I/O 202.

To identify the cause of variation in the output signal swing at 208, iTx is probed. However, as mentioned in the background section, measuring a small change in current of iTx may not be possible or feasible with probes because the probes themselves will change the behavior of iTx. In one embodiment, iTx is 180 uA. To identify the variation in iTx, in one embodiment, bias distribution circuits (203a, 203b, 204a, 204b) are used. These bias distribution circuits (203a, 203b, 204a, 204b) couple the bias generation circuit 201 with the oscillator 207.

In one embodiment, the bias distribution circuits are multiple current-to-voltage conversion circuits (203a, 203b, 204a, 204b). In another embodiment, other bias distribution circuits may be used. In one embodiment, the bias distribution circuits (203a, 203b, 204a, 204b) mimic the bias generation circuit 201 to provide a replica behavior of the bias generation circuit 201. The bias distribution circuit, in one embodiment, also includes circuit components similar to the I/O 202 to mimic the behavior of the voltages and currents of I/O 202. In one embodiment, the bias distribution circuits are current mirror circuits.

The final output of each bias generation circuit is one or more biases. In one embodiment, the biases are pbias and nbias—analog voltages. In another embodiment, the biases are current biases. In yet another embodiment, the biases are a combination of voltages and currents.

In one embodiment, the output from 204a, which is an in-die variation (IDV) block—part of the bias distribution circuit—is $pbias_1$ and $nbias_1$. The outputs from 204b, which in one embodiment is identical in design to 204a, is $pbias_2$ and $nbias_2$. These bias voltages, in one embodiment, are input to multiplexers 205 and 206 such that the outputs of the multiplexers 205 and 206 are pbias and nbias. In one embodiment, the outputs of the multiplexers 205 and 206 are input to the oscillator 207 that generates a signal at 209 having a frequency which is based at least in part on the values of pbias and nbias voltages.

FIG. 2B illustrates a circuit diagram of the oscillator 207, according to one embodiment of the invention. The oscillator 207, in one embodiment, has an odd number of delay elements e.g., 210-214. In one embodiment, an exemplary delay element 212 is a current starved inverter that is controlled by pbias and nbias voltages. The delay elements are configured to be in a feedback loop shown by the feedback node 215. The output out is an oscillating signal having a frequency which is dependent on the number of delay elements and the values of pbias and nbias.

Figure 3:
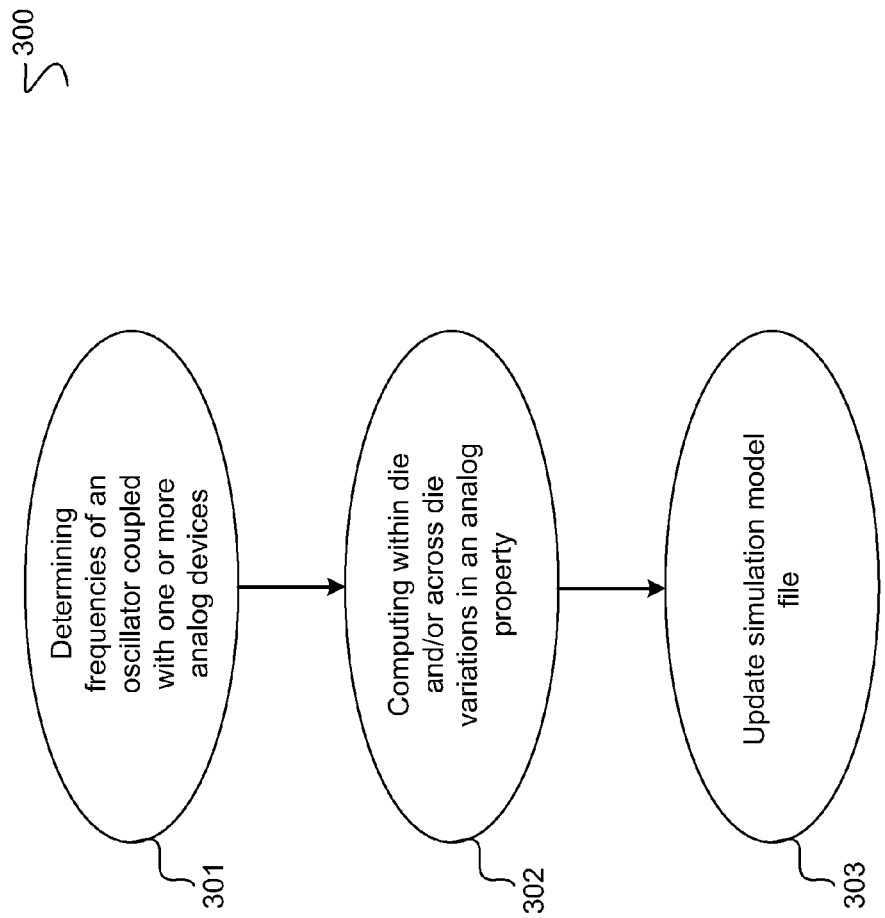
FIG. 3 is a high level flow chart illustrating an overall method for updating simulation model files with variation information of analog properties according to one embodiment of the invention.

FIG. 3 illustrates a method 300, according to one embodiment, for enabling high volume manufacturing (HVM) by computing within-die and across-die variations of analog properties (including output signal swing, gain, bandwidth, offset, and linearity and range of delay lines) associated with analog devices (such as I/Os, amplifiers, delay lines, etc).

At 301, oscillator frequency is determined. This oscillator frequency depends on the analog properties of analog devices. In one embodiment, the analog devices are I/O buffers 200 as shown in FIG. 2A, while the analog properties are output signal swing or impedance of the I/O buffers as indirectly represented by analog voltages pbias and nbias. The values of pbias and nbias voltages, as shown in FIG. 2A, control the frequency of the oscillator 207. At 301, the oscillator frequency of oscillators coupled with analog devices on the same and on different dies (and on same and/or different wafers) is also determined.

At 302, statistical analysis is performed to compute within-die and/or across-die variation in the analog property based on the determined oscillator frequencies. At 303, simulation model files (or process files) associated with the process technology of the analog devices is updated to reflect the within-die and/or across-die variation in the analog property. The updated simulation model file provides a better fit with the actual behavior of the analog circuits across multiple dies and wafers, thus enabling efficient HVM of the dies.

Figure 4:
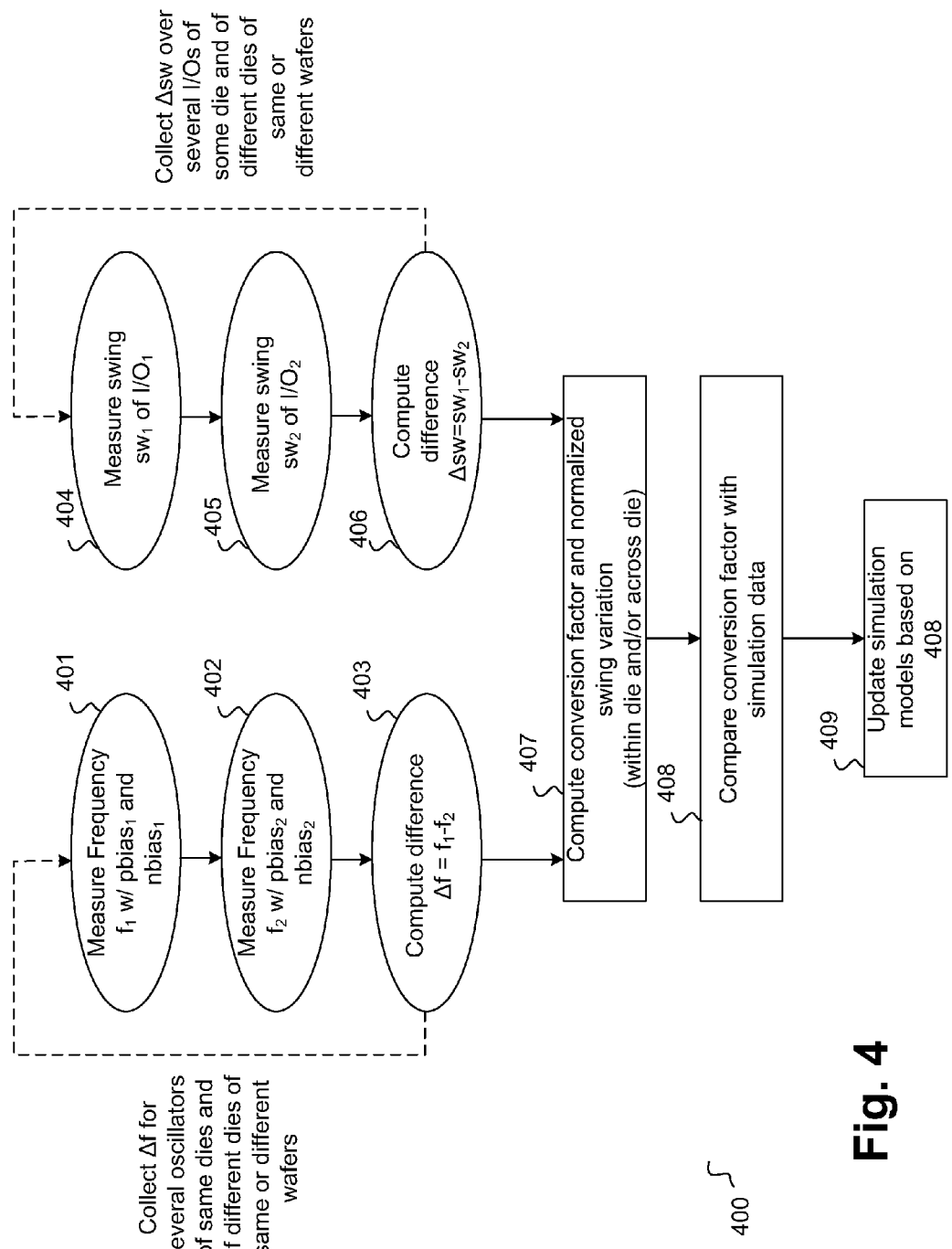
FIG. 4 is a flow chart illustrating a method for determining output signal swing variation used for updating simulation models according to one embodiment of the invention.

FIG. 4 illustrates a flowchart 400 of an exemplary embodiment of the method shown in FIG. 3. The method of FIG. 4 refers to the circuit shown in FIG. 2A. At 401, the oscillator frequency $f_1$ is measured and/or determined using $pbias_1$ and $nbias_1$ voltages. At 402, the oscillator frequency $f_2$ is measured and/or determined using $pbias_2$ and $nbias_2$ voltages. At 403, a difference ($\Delta f$) in the frequencies is computed i.e. $f_1-f_2$. The process 401-403, in one embodiment, is repeated for several oscillators of the same die and of different dies of the same or different semiconductor wafers.

At 404, the output signal swing $sw_1$ of $I/O_1$ is measured and/or determined. At 405, the output signal swing $sw_2$ of $I/O_2$ is measured and/or determined. At 406, a difference ($\Delta sw$) in output signal swing is computed. In one embodiment, the process 404-406 is repeated for several I/Os of the same die and of different dies of the same or different semiconductor wafers.

A conversion factor is then computed using the difference in frequencies determined at 403 and the difference in output signal swings determined at 406. At 407, in one embodiment, the conversion factor is computed by determining statistical properties. In one embodiment, the statistical standard deviation of the difference in frequencies and the difference of output signal swings are computed along with the statistical mean of the frequencies and output signal swings to generate the conversion factor), as shown below:

Conversion factor=(Normalized variation of the output signal swings)/(Normalized Variation of the Oscillator Frequency)

In one embodiment, the normalized variation of the output signal swings is determined by dividing the standard deviation of the difference of output signal swing with the statistical mean of the output signal swings. In one embodiment, the normalized variation of the oscillator frequency is determined by dividing the statistical standard deviation of the difference of oscillator frequencies with the statistical mean of the oscillator frequencies.

At 408, the conversion factor is compared with a simulated conversion factor. The comparison is made to improve the modeling accuracy of the simulation model files (process files) based on the conversion factor. At 409, the simulation models are updated based on the conversion factor (i.e. comparison result from 408).

It should be noted that the above described statistical method for computing variations is for illustration. Other known methods for computing variations can replace the method described above without changing the principle of the claimed subject matter.

TABLE 1

I/O output signal swing variation analysis results

| | Oscillator Frequency (MHz) | Swing (mV) | I/O Bias Current (uA) |
|---|---|---|---|
| Mean | 194 | 481 | 381.1 |
| Standard Deviation (Std_Dev$_{diff}$) of Difference | 11 | 24 | 10.11 |
| Normalization = Std_Dev$_{diff}$/Mean (%) | 5.67 | 4.99 | 2.65 |
| Conversion Factor | 1 | 0.88 | 0.47 |

In one embodiment, the within-die variation results of the I/O, shown in FIG. 2A and using the method of FIG. 4, are illustrated in Table 1.

Referring to Table 1, the first row, Mean, shows the mean of measured frequency of two or more oscillators (e.g., oscillator 207 in FIG. 2A) in the column labeled "Oscillator Frequency (MHz)" and the mean of measured output signal swing of two or more I/O buffers in the column labeled "Swing (mV)." The last column labeled "I/O Bias Current (uA)" shows the simulated equivalents of the bias current (iTx in FIG. 2A) sent to the I/O buffers. Standard deviation of the difference in frequencies and difference in output signal swings over several measurements on the same or different semiconductor dies are shown in the second row, Standard Deviation (Std_Dev$_{diff}$) of Difference. The ratio of Std_Dev$_{diff}$ and Mean expressed as a percentage (%) is shown in the third row. The fourth row, 'Conversion Factor,' shows the Std_Dev$_{diff}$/Mean of oscillator frequencies (e.g., of IDV oscillator) and I/O output signal swings normalized to Std_Dev$_{diff}$/Mean of the oscillator frequency (e.g., of IDV oscillator).

The conversion factor, in one embodiment, is used to update the simulation model files. Once the model files match measured results, variation in internal bias voltages and currents are predicted via the respective conversion factors without the need for difficult probing techniques.

Figure 5A:
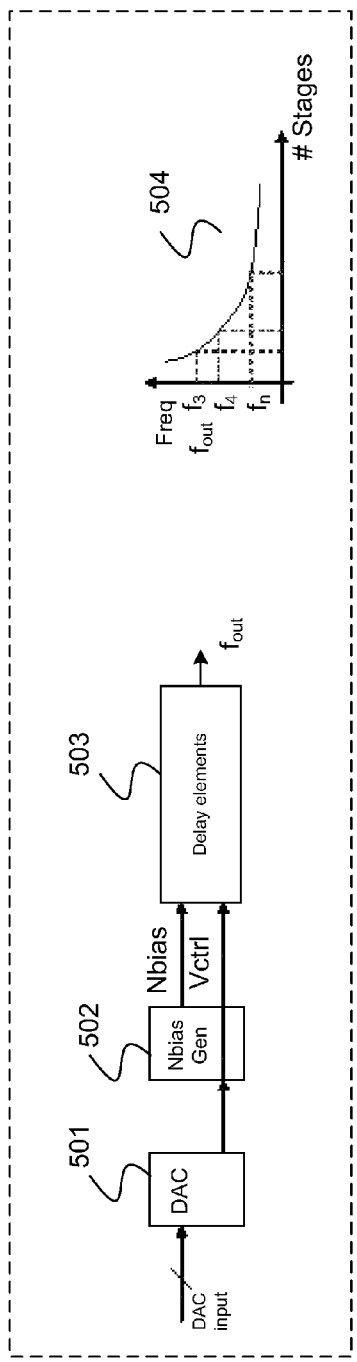
FIG. 5A is a block diagram used for analyzing linearity and delay range, analog properties, of a delay line according to one embodiment of the invention.
Figure 5B:
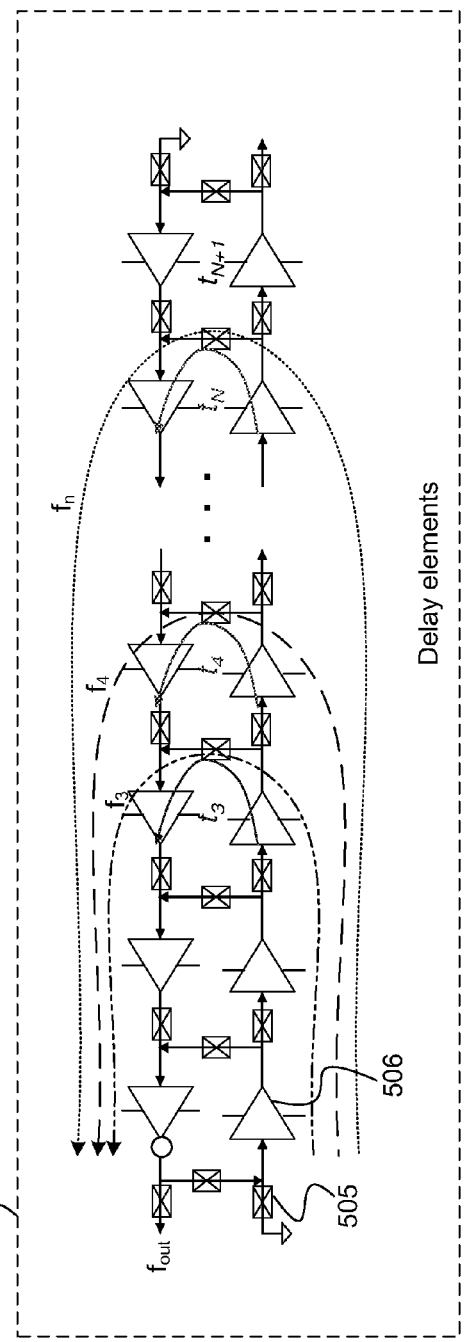
FIG. 5B is a delay line configurable as an oscillator with an adjustable number of delay stages (programmable loop length) to provide linearity and range analysis, analog properties, of the delay line according to one embodiment of the invention.

FIG. 5A and FIG. 5B illustrate a circuit topology for computing within-die and across-die variations in linearity and range of a delay line which is configured as an oscillator, according to one embodiment of the invention. Delay lines are generally used in delay locked loops (DLL). A DLL consists of a set of programmable delay elements (together called a delay line) whose delay can be adjusted via digital or analog techniques or a mix of the two techniques. DLLs are generally characterized by their linearity (or phase separation uniformity) and range. Linearity measurements on DLLs are typically time consuming and error prone. The errors come from downstream circuitry (distribution buffers, multiplexers, phase interpolators, etc.) and can significantly add to the delay line's variation. The embodiments of FIG. 5A and FIG. 5B extract linearity data of the delay line with great accuracy via the closed loop frequency.

Referring to FIG. 5A, in one embodiment, a digital to analog converter (DAC) 501 that is coupled with a bias generation circuit 502. The DAC 501, in one embodiment is a resistive divider that generates pbias. The bias generation circuit 502, in one embodiment, generates nbias and vctrl signals that control the speed, i.e., delay, of the delay line 503. The delay line 503, in one embodiment, is configured as an oscillator as shown in FIG. 5B. The delay of each delay cell 506 of the oscillator 503, in one embodiment, is adjustable via nbias and vctrl signals. The delay line, in one embodiment, is an adjustable delay line that can be configured to a number of delay settings via pass gates 505. For a given bias or delay setting, increasing the loop length (for example, going from $f_3$ to $f_4$) results in reducing the frequency of the loop. A graphical representation of the above relationship between loop length, as number of delay stages, and frequency is illustrated by 504. Frequencies $f_3$, $f_4$, and $f_N$ are based on the length of the delay line loop and the analog biases (nbais and vctrl).

Based on a mathematical expression, the difference in frequency between two consecutive loop lengths can be used to determine the incremental stage delay and associated variation.

If the average or effective delay of all 3 stages (shown by the dotted three paths in FIG. 5B) is $t_{eff,3}$, then the frequency of the ring oscillator will be given by:

$$f_3 = \frac{1}{2*3*t_{eff,3}}$$

The method of computing within-die and across-die variations in the linearity and range of the delay line, according to one embodiment, is described below.

The frequencies of the delay line oscillator 503 ($f_2$, $f_3$, . . . , $f_N$) for different loop lengths ($l_2$, $l_3$, . . . , $l_N$) is determined or measured. The effective delays of the delay elements (also called stage delays) are then calculated as:

$t_{eff,N} = 1/(2*N*f_N)$; for all $N$

The incremental stage delays are then calculated as:

stages$_{N-1 to N}=(N-1)*[(f_{N-1}/f_N)-1)]*t_{eff,N-1}$; for all $N$

The mean and standard deviations are then calculated for the incremental stage delays to measure variation in the delays. These variations are measured variations. The same process is applied to compute variation using simulation models. The variations of the simulation models and the measured variations are compared to determine any miscorrelation in the simulation model (process file). The simulation model is then updated based on the miscorrelation in the variations to enable improvement in circuit design and HVM.

FIG. 6A illustrates a block diagram configured to extract bandwidth, an analog property, of an amplifier, according to one embodiment of the invention. In one embodiment, the amplifier 604 receives differential inputs from a voltage controlled oscillator 603. The output of the analog amplifier 604, in one embodiment, is converted into a CMOS (i.e. full-swing) signal by a low-swing to CMOS converter 605. The DAC 601 receives digital signal, DAC_input, and converts it into analog representation. These analog signals from the DAC 601 and the Nbias generator 602, in one embodiment, generate bias voltages to control the frequency of the oscillator 603. The frequency to DAC code mapping, as shown in FIG. 6B, can be obtained by setting sel_vco signal to the multiplexer 606 to a '1' and feeding the output clock waveform into a counter 607. Once the oscillator 603 has been characterized, as shown by the graph in FIG. 6B, the amplifier 604 can be characterized too. In one embodiment, the amplifier 604 is characterized by setting sel_vco signal to the multiplexer 606 to a '0.' In such an embodiment, the frequency associated with the amplifier 604, as recorded by the counter 607, is measured.

The method, according to one embodiment, for computing within-die and across-die variation of the amplifier bandwidth is described below.

The VCO 603 (oscillator) is characterized by traversing through the DAC codes (DAC_input) of the DAC 601 and recording the frequency at the output of the counter 607. In the above step, sel_vco of the multiplexer 606 is set to 1. The amplifier 604 range is then characterized by traversing through the DAC codes of the DAC 601 and by recording the frequency of the waveform produced by the amplifier 603 and the low-swing to CMOS converter 605. Within the bandwidth of the amplifier 603, the frequency curves (as shown in FIG. 6B) should track each other. Outside the bandwidth of the amplifier 603, the frequency curves start to deviate as shown by 608 and 609 of FIG. 6B. The point of deviation is the bandwidth of the amplifier. In the given example, this point happens at DAC code #9, as shown in FIG. 6B.

FIGS. 6C, 6D, and 6E illustrate a circuit topology and corresponding illustrative graphs, according to one embodiment, for computing the within-die and across-die variation in the offset of an amplifier and gain of an amplifier. Offset, an analog property, is defined as the input differential voltage that results in zero output differential voltage. The differential voltages $V_{ip}$ 616 and $V_{in}$ 617 from the output of the DAC 610 ranges from the most positive at one end of the DAC code range to the most negative at the other end of the code range as shown by FIG. 6D. The differential outputs $V_{op}$ and $V_{on}$ from the amplifier 611 are alternately (i.e. one after the other) used to bias a ring oscillator 615 via the multiplexer 612. In one embodiment, the ring oscillator 615 is implemented as shown in FIG. 2B.

Referring back to FIG. 6D, the frequency of the oscillator 615 can be modulated, in one embodiment, by either nbias or pbias or both. The multiplexer 612, in one embodiment, is an analog multiplexer implemented as pass gates. The output of the multiplexer 612 is an analog voltage which is fed into the oscillator 615 via the multiplexers 613 and 614.

The method of computing within-die and across-die variation of offset of the amplifier 611 is described below, according to one embodiment of the invention.

The common mode level of the amplifier 611 is determined to identify whether the amplifier 611 has a high or low output common mode. Then the multiplexers 613 and 614 are set via select bit high_vcm appropriately. In one embodiment, for amplifiers with a high output common mode, the signal high_vcm is set to a '1', while for amplifiers with a low output common mode, the signal high_vcm is set to a '0.' In one embodiment, when the signal high_vcm is set to a '1,' the amplifier's output is connected with the nbias terminal of the oscillator while the pbias terminal of the oscillator is connected with a fixed bias, fixed_pbais. In another embodiment, when the signal high_vcm is set to a '0,' the amplifier's output is connected with the pbias terminal of the oscillator while the nbias terminal of the oscillator is connected with a fixed bias, fixed_nbais. The DAC codes of DAC 610 are then swept (traversed) so that the input differential voltages, $V_{ip}$ and $V_{in}$ change from the most positive to the most negative voltages. For each DAC code, the amplifier's output voltages, $V_{op}$ and $V_{on}$, are used alternately to bias the oscillator 615.

From the oscillator frequency and DAC code data for $V_{op}$ and $V_{on}$, the point of intersection of the $V_{op}$ and $V_{on}$ frequency is determined.

FIG. 6E illustrates a graph of $V_{op}$, 618 and $V_{on}$ 619, according to one embodiment. The point of intersection of the two curves $V_{op}$, 618 and $V_{on}$ 619, in one embodiment, is the input differential voltage required to ensure zero (or substantially close to zero) output differential voltage. The DAC code, k, associated with the point of intersection is then converted to a voltage depending on the designed/characterized resolution of the DAC 610. The statistical mean and statistical standard deviation of the DAC codes corresponding to $V_{op}/V_{on}$ intersection is determined. These statistical parameters provide input offset variation which may be within-die or across-die variations.

The method of computing within-die and across-die variation of gain of the amplifier 611 is described below, according to one embodiment of the invention.

The outputs of the DAC, $V_{ip}$ and $V_{in}$, in one embodiment, are alternately coupled with the bias terminals of the oscillator 615. If the DAC outputs, $V_{ip}$ and $V_{in}$, have a high common mode, $V_{ip}$ and $V_{in}$ are connected to nbias while pbias is held at a fixed bias. If the DAC outputs, $V_{ip}$ and $V_{in}$, have a low common mode, they are connected to pbias while nbias is held at a fixed bias. The DAC codes for the DAC 610 are then swept (traversed) so that the frequency of the oscillator 615 is determined for each DAC code. Using the designed DAC transfer curves for output voltage vs. input code (See FIG. 6D) and the characterized DAC transfer curves for oscillator frequency vs. input code (See FIG. 6E), the frequency of the oscillator 615 is mapped to a voltage to generate a voltage vs. frequency mapping (not shown). Using the voltage vs. frequency mapping, frequencies from $V_{op}$, $V_{on}$, $V_{ip}$, and $V_{in}$ vs. DAC code graphs, are translated to corresponding voltages to generate a voltage vs. DAC code graph for $V_{op}$, $V_{on}$, $V_{ip}$ and $V_{in}$. Amplifier gain can be determined by $(V_{op}-V_{on})/(V_{ip}-V_{in})$ for each DAC code setting.

Elements of embodiments are also provided as a machine-readable medium for storing the computer-executable instructions. The machine-readable medium may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program which may be transferred from a remote computer (e.g., a server) to a requesting computer (e.g., a client) by way of data signals via a communication link (e.g., a modem or network connection).

While the invention has been described in conjunction with specific embodiments thereof, many alternatives, modifications and variations will be apparent to those of ordinary skill in the art in light of the foregoing description.

For example, the oscillator may be configured to receive analog current biases instead of analog voltage biases to generate frequency. Similarly, the oscillator 207 of FIG. 2B may be designed with fully differential delay elements with the same or different number of delay stages. Referring to FIG. 2A, in one embodiment, a single oscillator is coupled with each I/O buffer that reuses the same biases as being used by the I/O buffer. In one embodiment the multiplexers 205 and 206 receive biases used by one or more I/O buffers in addition to the biases from the Rx bias distribution 203a.

Similarly, the amplifier 604 of FIG. 6A may be designed to have enough gain to generate CMOS signals (i.e. full swing signals), and therefore not requiring the additional low-swing to CMOS stage 605. Similarly, DAC 610 of FIG. 6C may be designed as a single-ended DAC generating only $V_{ip}$, while $V_{in}$ is held static by other means (for example, using a resistive divider).

The embodiments of the invention are intended to embrace all such alternatives, modifications, and variations as to fall within the broad scope of the appended claims

We claim:

1. An apparatus comprising:
   a bias generator to generate a bias signal which is a non-digital signal; and
   a delay line having a plurality of delay elements and operable as an oscillator, the delay line coupled to the bias generator to receive the bias signal to adjust a delay of the plurality of delay elements, the delay line operable to generate two frequencies corresponding to delays of two consecutive delay loops of the plurality of delay elements,
   wherein within-die or across-die variations in linearity or delay range of the delay line is determined via a difference in the two frequencies corresponding to the delays of the two consecutive delay loops.

2. The apparatus of claim 1, wherein the bias signal is an analog voltage or current for biasing the delay line, the bias signal to adjust a delay of the two consecutive delay loops.

3. The apparatus of claim 1 further comprises a digital-to-analog converter (DAC) to provide an analog voltage to the bias generator to generate corresponding bias signal for the delay line.

4. The apparatus of claim 1, wherein the delay line comprises pass-gate transistors which are operable to form the two consecutive delay loops of the plurality of delay elements.

5. The apparatus of claim 1 further comprises a logic unit to measure incremental delay associated with the delay element for each of the two consecutive delay loops.

6. The apparatus of claim 1, wherein a first loop of the two consecutive loops is on a first semiconductor die of a wafer, while the second loop of the two consecutive loops is on a second semiconductor die of the wafer.

7. A method comprising:
   determining two frequencies of a delay line operable as an oscillator, the delay line having a plurality of delay elements, wherein the two frequencies correspond to delays of two consecutive delay loops of the plurality of delay elements;
   measuring delays corresponding to the two consecutive delay loops of the plurality of delay elements of the delay line;
   determining incremental delay, of each delay element of the plurality of delay elements, according to the measured delays;
   determining a statistical mean of the incremental delay;
   determining a statistical standard deviation of the incremental delay;
   determining a statistical mean of a difference between an incremental delay of at least two delay elements of the plurality of delay elements;

determining a statistical standard deviation of a difference between an incremental delay of at least two delay elements of the plurality of delay elements; and determining within-die or across-die variations in linearity or delay range of the delay line by determining a difference in the two frequencies.

8. The method of claim 7 further comprises:
determining a statistical mean of the two frequencies; and
determining a statistical standard deviation of the difference in the two frequencies.

9. The method of claim 8, wherein determining the within-die or the across-die variations further comprises:
determining a normalized variation of the incremental delay via the standard deviation of the difference in the incremental delay and via the statistical mean of the incremental delay;
determining a normalized variation of the two frequencies via the standard deviation of the difference in the two frequencies and via the statistical mean of the two frequencies; and
determining a conversion factor of incremental delay via the determined normalized variation of the incremental delay and via the normalized variation of the two frequencies.

10. The method of claim 9 further comprises receiving, by the delay line, analog voltages or currents which in part determine the two frequencies.

11. The method of claim 7 further comprises updating a simulation model file based on determining the within-die or across-die variations in the linearity or delay range of the delay line.

12. A method comprising:
determining two frequencies of an oscillator coupled with first and second input-output (I/O) buffers, the first and second I/O buffers for coupling with first and second transmission media, the two frequencies based on first and second output impedances of the first and second I/O buffers respectively; and
determining within-die or across-die variations in the first and second output impedances of the first and second I/O buffers respectively, wherein determining the within-die or across-die variations is based on the two oscillator frequencies.

13. The method of claim 12 further comprises determining a difference in the oscillator frequency, wherein determining the within-die or the across-die variations in the first and second output impedances comprises determining within-die or across-die variations in the first and second output impedances of the first and second I/O buffers based on the difference in the two frequencies of the oscillator.

14. The method of claim 13 further comprises:
measuring the first and second output impedances of the first and second I/O buffers respectively in response to the determining the difference in the two frequencies of the oscillator; and
determining a difference between the measured first and second output impedances.

15. The method of claim 14 further comprises:
determining a statistical mean of the measured first and second output impedances; and
determining a statistical standard deviation of the difference in the measured first and second impedances.

16. The method of claim 15 further comprises:
determining a statistical mean of the oscillator frequency of the first and second I/O buffers; and
determining a statistical standard deviation of the difference in the two frequencies of the oscillator for the first and second I/O buffers.

17. The method of claim 16, wherein determining the within-die or the across-die variations further comprises:
determining a normalized variation of the first and second output impedances via the standard deviation of the difference in the measured first and second output impedances and via the statistical mean of the measured output impedances;
determining a normalized variation of the oscillator frequency via the standard deviation of the difference in the oscillator frequency and via the statistical mean of the oscillator frequency;
determining a conversion factor of output impedances via the determined normalized variation of the first and second output impedances and via the normalized variation of the oscillator frequency; and
updating a simulation model file based on determining the within-die or across-die variations in the first and second output impedances of the first and second I/O buffers respectively.

18. The method of claim 12 further comprises:
receiving, by the oscillator, analog voltages or currents associated with each of the first and second output impedances, wherein the analog voltages or currents in part determine the two frequencies of the oscillator.

* * * * *